US005247269A

United States Patent [19]

Boulouard et al.

[11] Patent Number: 5,247,269

[45] Date of Patent: Sep. 21, 1993

[54] TWO-WAY DUPLEXER FOR POLARIZED MICROWAVES

[75] Inventors: André Boulouard, Treguier; Marie-Laure Chares, Lannion; Michel Le Rouzic, Pleumeur Bodou, all of France

[73] Assignee: France Telecom, Paris, France

[21] Appl. No.: 738,106

[22] Filed: Jul. 30, 1991

[30] Foreign Application Priority Data

Aug. 24, 1990 [FR] France ............................ 90 10753

[51] Int. Cl.[5] ........................................ H03H 11/34

[52] U.S. Cl. ................................ 333/126; 333/132; 333/21 A

[58] Field of Search ............... 333/117, 126, 129, 132, 333/136, 156, 21 A; 370/36, 37, 123

[56] References Cited

U.S. PATENT DOCUMENTS

| | | | |
|---|---|---|---|
| 3,093,824 | 6/1963 | Ammerman | 342/365 |
| 3,517,317 | 6/1970 | Sire | 370/37 X |
| 3,581,242 | 5/1971 | Lavedan | 333/21 A X |
| 3,768,043 | 10/1973 | Foldes | 333/21 A X |
| 3,963,990 | 6/1976 | Di Fonzo | 333/21 A X |
| 4,115,782 | 9/1978 | Han et al. | 343/779 |
| 4,994,773 | 12/1991 | Chen et al. | 333/164 |

FOREIGN PATENT DOCUMENTS

| | | |
|---|---|---|
| 0218549 | 4/1987 | European Pat. Off. . |
| 3110599A1 | 9/1982 | Fed. Rep. of Germany . |
| 57-107651A | 7/1982 | Japan . |
| 58-3339A | 1/1983 | Japan . |

OTHER PUBLICATIONS

"Solid State Control Devices: State of the Art," A. K. Sharma, *Microwave Journal*, 1989 State of the Art Reference, Sep. 1989, Suppl., No. 9, p. 95.

*Primary Examiner*—Benny T. Lee

*Attorney, Agent, or Firm*—Merchant & Gould Smith, Edell, Weller & Schmidt

[57] ABSTRACT

Disclosed is a novel two-way duplexer structure for the simultaneous transmission and reception of circularly polarized microwaves. This two-way duplexer of the type designed to connect a first set of two inputs/outputs to a second opposite set of two inputs/outputs, each input/output of said duplexer being connected to the combination channel of a combiner/divider, the two division channels of each combiner/divider each providing for the connection with one of the division channels of one of the combiners/dividers connected to a distinct input/output of the opposite set of inputs/outputs, through distinct phase-shifting means.

25 Claims, 5 Drawing Sheets

TWO-WAY DUPLEXER FOR POLARIZED MICROWAVES

BACKGROUND OF THE INVENTION

1. Field of the Invention

The field of the invention is that of components for the processing of polarized microwave signals and, more particularly, duplexers of circularly polarized waves. These components may notably constitute a stage of a transmitter and/or a receiver of circularly polarized waves in microwave applications.

In a known way, in satellite transmission, the waves transmitted are often circularly polarized. The reception of a circularly polarized wave is done by means of two antennas, one of the antennas being polarized vertically and the other being polarized horizontally. Thus, the vertical and horizontal components of a right-hand circularly polarized wave are each received by a distinct antenna and may be combined by power coupling to reconstitute the circularly polarized wave transmitted. The same reasoning may be applied to a left-hand circularly polarized wave. The vertical and horizontal components received should have a differential phase-shift of 90 degrees precisely, to avert a power loss in the system.

An object of the invention is to provide a duplexer providing notably for this function of recombination of the linear components of a circular wave received or, inversely, for the decomposition of a circular wave into its linear components at transmission.

2. Description of the Prior Art

There are known devices for the recombination, at reception, of the circular wave received by two antennas at 90°. These devices are usually formed by a three-port hybrid structure. Such three-port hybrid structures are described, for example, in the journal "R. F. Design", July 1989, pp. 56 to 59. This document describes hybrid structures consisting of pi or Tee type Wilkinson combiners/dividers. Wilkinson combiners/dividers are highpass or lowpass filters that can be used either to obtain the sum of two signals or to divide a single signal into two equal signals, depending on their use.

In a known way, the same type of hybrid structure may also be used at transmission to decompose the wave to be transmitted into two components, a horizontal and a vertical component, applied to a set of two antennas with orthogonal polarizations.

It is quite clear that each of these components cannot work simultaneously in transmission and in reception. In fact, with components of this type, a device that has to both transmit and receive circular waves requires two distinct signal processing units working with two distinct local oscillators, one used for the reception of the signals and the other for their transmission.

However, there is a need for compactness and convertibility of components of this type, especially in onboard applications, where it is advantageous to make one and the same component fulfil several functions when possible.

The present invention is designed notably to meet this need.

More precisely, an object of the present invention is to provide a duplexer structure that can be used, when it is linked to a set of antennas, to transmit circularly polarized signals, right-hand as well as left-hand (with the same structure), from the vertical and horizontal linear polarizations of a microwave signal.

Another aim of the present invention is to provide a structure such as this that also enables the reception of right-hand as well as left-hand circularly polarized waves from the vertical and horizontal linear polarizations of a microwave signal.

Another aim of the present invention is to provide a structure such as this enabling the simultaneous transmission and reception of crossed circularly polarized signals.

Another aim of the present invention is to provide a duplexer such as this having an operating frequency band of about 11.7 to 12.5 GHz.

An additional aim of the present invention is to enable a two-way structure such as this to be made by MMIC (monolithic microwave integrated circuit) technology, for example on gallium arsenide, notably to reduce its bulk and its consumption.

SUMMARY OF THE INVENTION

These aims, as well as others that shall appear hereinafter, are achieved by means of a two-way duplexer for polarized microwaves, of the type designed to connect a first set of two inputs/outputs to a second set of two inputs/outputs, wherein each input/output of the duplexer is connected to the combination channel of a combiner/divider, and wherein the two division channels of each combiner/divider each provide respectively for the connection with one of the division channels of one of the combiners/dividers connected to a distinct input/output of the opposite set of inputs/outputs, through distinct phase-shifting means.

The combination channel of a combiner/divider is defined as being the one in which there is obtained the sum of the signals applied to the two division channels of the combiner/divider. When the combiner/divider is used as a "divider", the combination channel is the one to which there is applied a signal to divide it into two equal signals.

The division channels of a combiner/divider are defined as being those to which there are applied two signals which are to be summed up, i.e. combined, the results of the summing being obtained on the combination channel. The division channels are, conversely, also those in which there are obtained two equal signals resulting from the splitting, into two, of a signal applied to the combination channel of the combiner/divider, when said combiner/divider is used as a divider.

Advantageously, the combination/division means are the Wilkinson Tee or pi type three-port structures, each phase-shifting by +90° or −90°.

Preferably, the duplexer according to the invention includes Tee or pi structure phase-tuning means, each positioned between the combination channels of combiners/dividers and the two inputs/outputs of one of said sets of inputs/outputs of said duplexer.

The phase-tuning means have the function of precisely tuning a differential phase-shift of 90° between the signals emerging from or entering the duplexer, notably to prevent transmission power loss and cross-talk between the signals.

According to an advantageous embodiment of the present invention, the phase-tuning means comprise field-effect transistors mounted as variable capacitors.

The advantage of this type of assembly is that the tuning of the phase of a signal can be controlled by adjusting the gate voltage of the field effect transistors.

Furthermore, the duplexer according to the invention thus has a current consumption that is almost zero in continuous operation, the only consumption coming from the leakage current of the field effect transistors.

Advantageously, the phase-shifting means provide for a $+\pi/4$ or $-\pi/4$ phase shift. They may be constituted by highpass or lowpass type phase-shifting cells.

Preferably, the sign (+ or −) of the $\pi/4$ phase-shift is assigned selectively to each of the phase-shifting means of the structure so that, with each of the inputs-/outputs of a first of said sets conveying a distinct (vertical or horizontal) linear component, the corresponding circularly polarized wave is transmitted or received selectively at either one of the inputs/outputs of the opposite set, depending on whether the polarization is a right-hand polarization or a a left-hand polarization.

Advantageously, the inputs/outputs of the sets are matched to 50Ω.

In a preferred embodiment of the present invention, a duplexer such as this is made by monolithic technology on gallium arsenide. An implantation such as this enables a considerable reduction in the space taken up by the duplexer according to the invention.

Preferably, one of the sets of two inputs/outputs is connected to a set of antennas with vertical and horizontal polarization, and the other set of said sets of two inputs/outputs is connected to a transmission and/or reception unit.

The duplexer according to the invention is preferably used for the transmission and reception of right-hand as well as left-hand circularly polarized signals.

Finally, the duplexer according to the invention is well-suited to the simultaneous transmission and reception of crossed circularly polarized signals.

BRIEF DESCRIPTION OF THE DRAWINGS

Other features and advantages of the present invention shall appear from the following description of a preferred embodiment and from the appended drawings, of which.

MORE DETAILED DESCRIPTION

Figure 1:
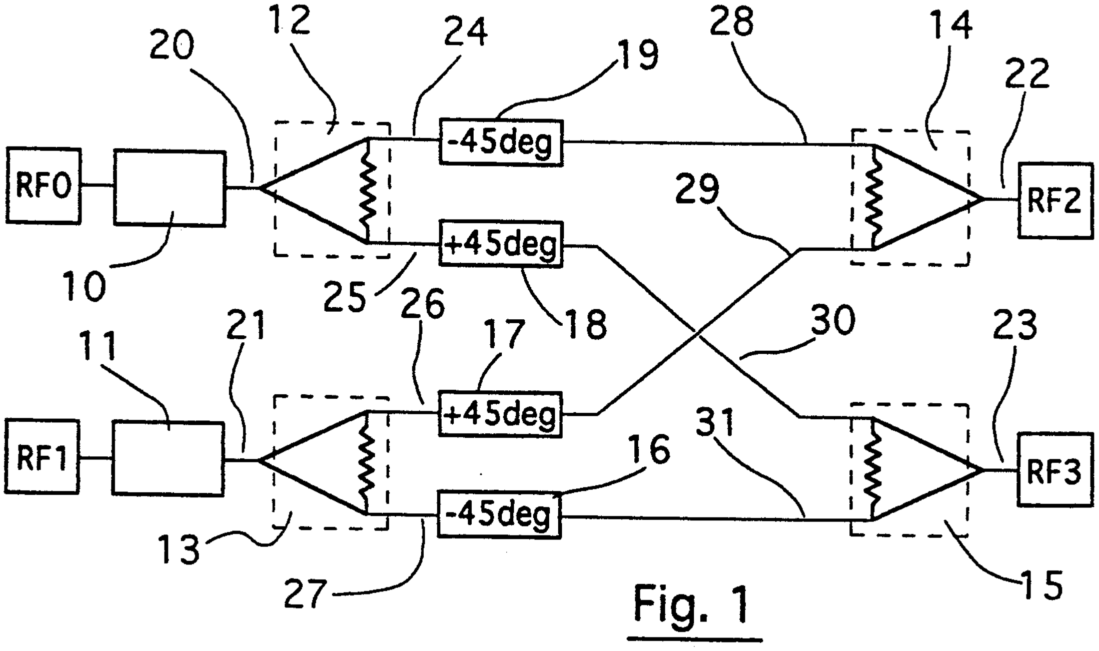
FIG. 1 is a block diagram of a duplexer according to the present invention.

FIG. 1 is a block diagram of a duplexer according to the present invention.

The duplexer according to the invention has a structure formed by two identical arms, each comprising two inputs/outputs RF0, RF1; RF2, RF3. Each input/output RF0, RF1, RF2, RF3 is connected to a combination channel 20, 21, 22, 23 of a combiner/divider 12, 13, 14, 15. Each combiner/divider 12, 13, 14, 15 has two division channels, respectively referenced 24, 25, 26, 27, 28, 29, 30, 31. The combiners/dividers 12, 13, 14 and 15 enable either the division into two equal signals of a signal applied to their combination channels 20, 21, 22, 23, the two equal signals being then presented on the division channels 24, 25, 26, 27, 28, 29, 30, 31, or the summing up of two signals presented to the division channels 24, 25, 26, 27, 28, 29, 30, 31, the result of the summation then appearing on the combination channels 20, 21, 22 and 23.

The combination channels 20, 21, 22 and 23 of each combiner/divider 12, 13, 14 and 15 are each connected to an input/output of a group of inputs/outputs RF0, RF1, RF2, RF3 and the division channels 24 to 31 of the combiners/dividers of a group of inputs/outputs RF0, RF1, RF2, RF3 are connected to the division channels of the combiners/dividers connected to the inputs/outputs of the other group of inputs/outputs through phase-shifting means 16, 17, 18, 19.

The phase-shifting means 16, 17, 18, 19 phase shift the signal by ±45°. Thus, each combination/division means of one of the sets of inputs/outputs carries out a summation of a signal phase-shifted by $+\pi/4$ coming from a first input of the other set of inputs/outputs and a signal phase-shifted by $-\pi/4$ coming from a second input of the other set of inputs/outputs.

Each of the inputs/outputs RF0, RF1, RF2 and RF3 has an impedance of 50Ω at input and at output.

In a preferred embodiment of the present invention, the inputs/outputs RF0 and RF1 are connected to antennas, one of the antennas being polarized horizontally, and the other one being polarized vertically.

For the phase difference between the two arms to be precise, it is advantageous to position phase-tuning cells 10 and 11 between the inputs/outputs RF0 and RF1 and the combiners/dividers 12, 13. The cells 10, 11 have the function of making a precise tuning of a differential phase-shift of 90° between the signals that enter or leave the two arms. This function makes it possible to avoid any crosstalk among the signals sent by the duplexer or those coming from the antennas.

The combiners/dividers 12, 13, 14 and 15 are advantageously of the Wilkinson type, based on Tee structure cells, each carrying out a phase-shift by −90° between 50 and 100Ω. Thus, combiners-dividers matched to 50Ω are obtained at input and at output (according to another embodiment, the combiners/dividers 12, 13, 14 and 15 each phase-shift by +90° between 50 and 100Ω).

The following description of FIGS. 2A, 2B, 3A, 3B, 4A and 4B will enable the duplexer according to the present invention to be understood.

As shown in FIGS. 2A, 2B, 3A, 3B, 4A and 4B, the inputs-outputs RF0 and RF1 are respectively connected to a horizontal polarization antenna and to a vertical polariztion antenna. Transmitter 1 receiver modules are connected to the inputs/outputs RF2 and RF3 in order to transmit/receive signals CD and CG, respectively.

Figure 2A:
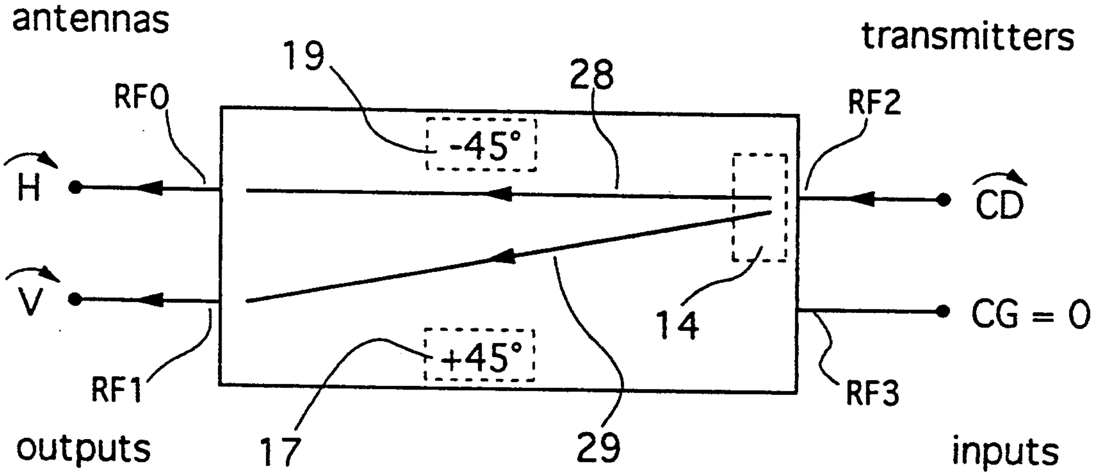
FIGS. 2A and 2B show the working, in transmission, of the duplexer according to the present invention.
Figure 2B:
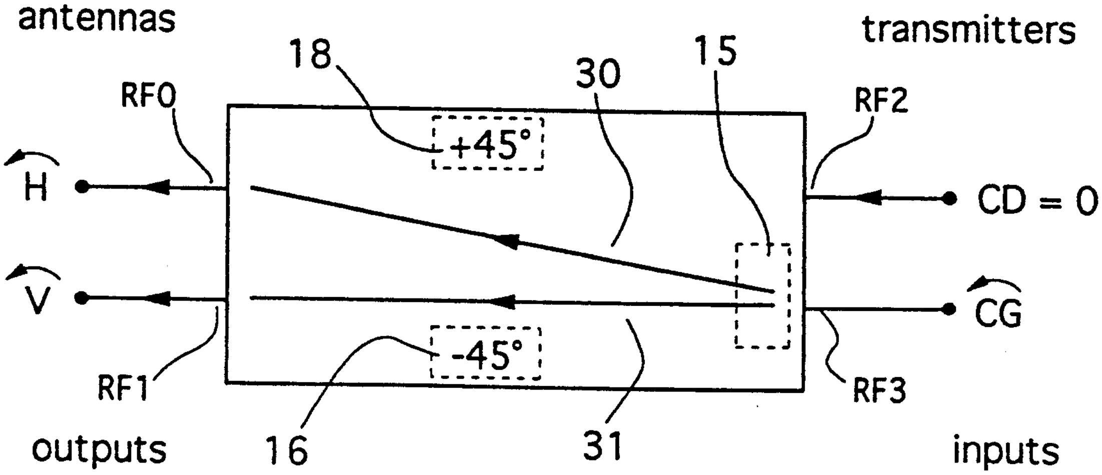

FIGS. 2A and 2B show the working, in transmission mode, of the duplexer according to the present invention.

At transmission, the microwave signal goes through the structure of the invention in the direction indicated by the arrows.

FIG. 2A shows the working of the duplexer according to the invention during a transmission of a right-hand circularly polarized signal (referenced CD). No signal is applied to duplexer input/output RF3 (i.e. CG=0).

A right-had circularly polarized signal to be transmitted is applied to the input/output RF2 of the duplexer and is divided into two components by the combiner/divider 14. The channel 28 phase-shifts the signal resulting from the division by an angle of −45° through the phase-shifter 19 and the channel 29 phase-shifts the other part of the signal by +45° through the phase-shifter 17. The two signals are then applied to two separate antennas with vertical (V) and horizontal (H) polarization.

FIG. 2B shows the working of the duplexer according to the invention during the transmission of a left-hand circularly polarized signal (referenced CG). No signal is applied to duplexer input/output RF2 (i.e. CD=0).

A left-hand circularly polarized signal to be transmitted is applied to the input/output RF3 of the duplexer divided into two components and transmitted along channels 30 and 31, respcetively, by the combiner 1 divider 15, with the phase-shifter 16 of the channel 31 phase-shifting the signal by −45°, and the phase-shifter 18 of the channel 30 phase-shifting the signal by +45°. The resultant signals are appled to two separate antennas with vertical polarization V and horizontal polarization H.

The duplexer according to the present invention therefore enables the transmission, depending on the chosen input/output channel, RF2 or RF3, of a right-hand or left-hand circularly polarized signal.

Figure 3A:
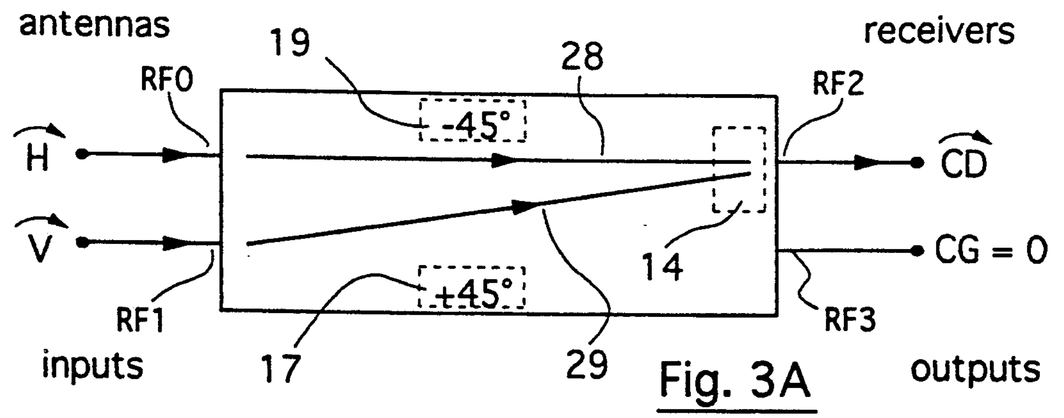
FIGS. 3A and 3B show the working, in reception, of the duplexer according to the present invention.
Figure 3B:
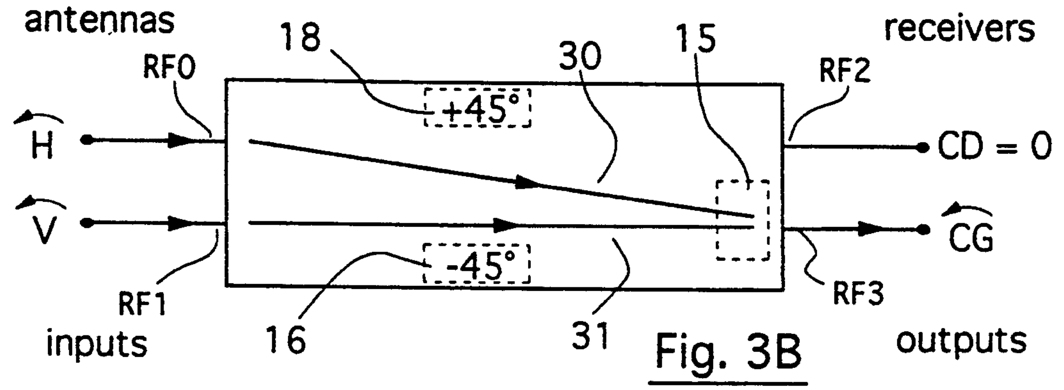

FIGS. 3A and 3B represent the working of the duplexer according to the present invention in reception.

In reception, the signals received by the two antennas go through the duplexer according to the invention in the direction indicated by the arrows. The inputs/outputs RF2 and RF3 are connected to processing units that act as receivers.

FIG. 3A shows the working of the duplexer in the mode of reception of the vertical V and horizontal H components of a right-hand circularly polarized signal and FIG. 3B shows the working of the duplexer in the mode of reception of the vertical V and horizontal H components of a left-hand circularly polarized signal.

The signals present at the two input channels RF0 and RF1 are respectively horizontal H and vertical V polarized signals.

In FIG. 3A, the signals received by the antennas are the vertical V and horizontal components of a right-hand circularly polarized signal.

The signal applied to the input/ouptut RF1 is phase-shifted by +45° by the phase-shifter 17, and the signal applied to the input/output RF0 is phase-shifted by −45° by the phase-shifter 19. The resultant signals are then combined by the combiner/divider 14 to obtain a right-hand circularly polarized signal CD at the output RF2.

No signal appears at RF3 (i.e. CG=0), since no component of a left-hand circularly polarized signal has been received by the antennas.

In FIG. 3B, the signals received by the antennas are the vertical V and horizontal H components of a left-hand circularly polarized signal.

The signal applied to the input/output RF0 is phase-shifted by +45° by the phase-shifter 18. The signal applied to the input/output RF1 is also phase-shifted by −45° by the phase-shifter 16. The combiner/divider 15 sums up the signals emerging from the phase-shifters 16 and 18, and a left-hand circularly polarized signal CG is obtained at the output RF3.

No signal appears at the output RF2 (CD=0), since no component of a right-hand circularly polarized signal has been received by the antennas.

The duplexer according to the present invention therefore enables the reception of the right-hand or left-hand circularly polarized signals. It may be considered to be a polarization discriminator.

Figure 4A:
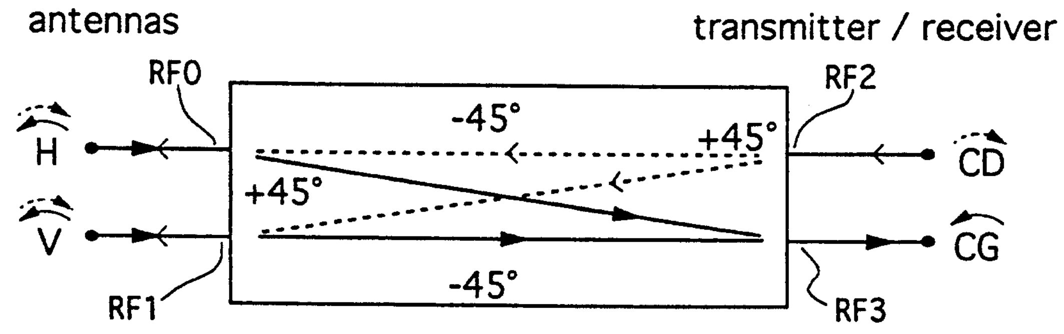
FIGS. 4A and 4B show the simultaneous working, in transmission and reception, of the duplexer according to the present invention.
Figure 4B:
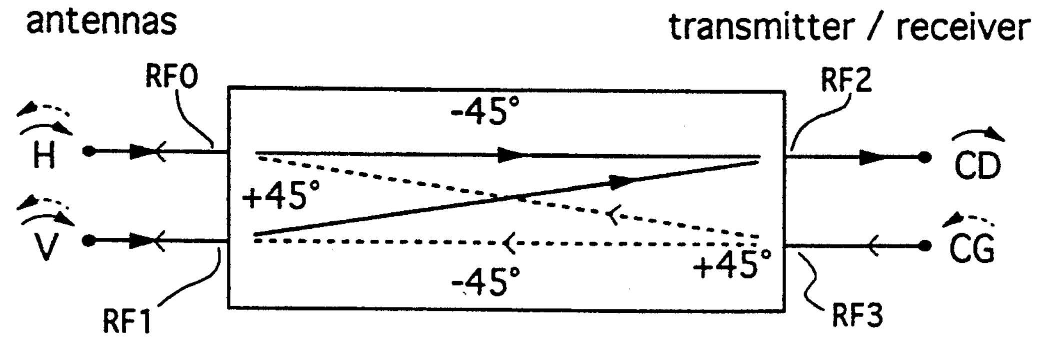

FIGS. 4A and 4B represent the simultaneous working, in transmission and reception, of the duplexer according to the present invention. In FIGS. 4A and 4B, the input-outputs RF0 and RF1 are connected to a horizontal polarization antenna and a vertical polarization antenna, respectively, while input-outputs RF2 and RF3 are connected to transmitter/receiver modules.

FIG. 4A shows the simultaneous working of the duplexer according to the present invention in mode of transmission of a right-hand cirularly polarized signal CD (dashes) and in mode of reception of a left-hand circularly polarized signal CG (solid lines).

A right-hand circularly polarized signal is applied by a transmitter to the input/output RF2 of the duplexer and divided into two signals by the combiner/divider 14 (FIGS. 1, 2A and 3A), each of the resultant signals being subsequently phase-shifted, one by +45° by the phase-shifter 17 and the other by −45° by the phase-shifter 19, then applied respectively to a vertical V and horizontal H polarization antenna.

The resultant signal CD transmitted is a right-hand circularly polarized signal.

During the transmission of this signal, the verical V and horizontal H components of a left-hand circularly polarized signal CG (solid line) are picked up by the set of antennas attached to input-outputs RF0 and RF1. The division of each of these signals, the phase-shifts applied and the combination of the resultant signals work as described with reference to FIG. 3B.

The duplexer according to the invention therefore enables the transmission of a right-hand circularly polarized signal simultaneously with the reception of the components of a left-hand circularly polarized signal.

FIG. 4B shows the simultaneous working of the duplexer according to the present invention in the mode of transmission of a left-hand circularly polarized signal CG (dashes) and in the mode of reception of a right-hand circularly polarized signal CD (solid lines).

The operation shown is similar to those described with reference to figures 2B and 3A, this operation being simultaneous.

The structure of the duplexer according to the present invention therefore makes it possible both to transmit a right-hand circularly polarized signal and to receive a left-hand circularly polarized signal, and vice versa.

One of the advantages of the present invention is that the transmission and reception can be done simultaneously at the same frequency, i.e. that one and the same local oscillator can be used in transmission and in reception.

Figure 5:
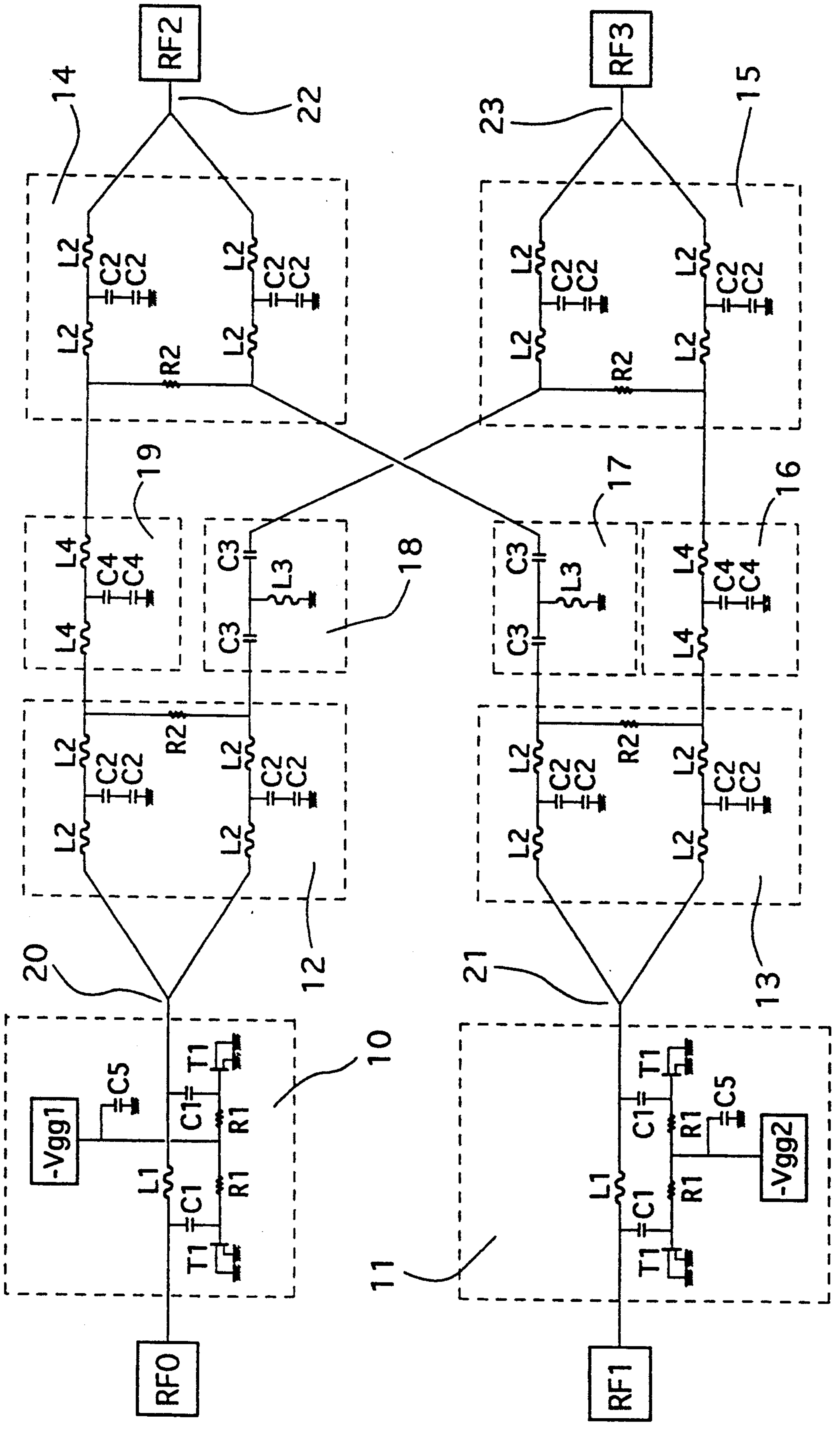
FIG. 5 is a detailed drawing of a preferred embodiment of the structure of the duplexer of the present invention.

FIG. 5 is a detailed diagram of a preferred embodiment of the structure of the two-way duplexer according to the invention.

This detailed diagram is in accordance with the block diagram of FIG. 1.

The figure shows the four inputs/outputs RF0, RF1, RF2 and RF3 constituting two sets of opposite inputs-/outputs, the combination/division means 12, 13, 14, 15 and the phase-shifter modules 16, 17, 18 and 19.

The inputs/outputs RF0, RF1, RF2 and RF3 advantageously have an input impedance of 50 Ω.

Phase-tuning cells 10 and 11 are positioned between the crossed structure of the duplexer and the antennas connected to the inputs/outputs RF0 and RF1.

The phase-tuning cells 10 and 11 have a pi structure and constitute lowpass type filters C1, L1, C1. To enable a precise tuning of the phase, since the signals that come from the antennas and/or that are injected into the antennas have to be phase-shifted by 90°, the present invention proposes to use variable capacitors constituted by field effect transistors T1, the drain and source of which are connected to the ground. In this configuration, the transistors T1 have capacitances which vary according to the gate bias voltages Vgg1 and Vgg2, respectively. Gate bias voltages Vgg1 and Vgg2 are connected through resistors R1 to the gates of transistors T1 and through capacitors C5 to ground.

According to a preferred embodiment of the present invention, the voltages Vgg1 and Vgg2 applied to the gates of the transistors T1 are adjusted manually.

It is naturally possible to adjust these voltages in another way, notably by means of an automatic control loop measuring the phase difference between the signals present at the points RF0 and RF1. It goes without saying that the phase setting can be done by any other appropriate means. The transistors T1 may, for example, be replaced by reverse biased varactor diodes, their capacitance varying as a function of the voltage applied to their cathode.

As already specified, the combination/division means 12, 13, 14 and 15 are advantageously three-port Wilkinson type means. They are based on Tee cells (L2, C2, L2) each phase-shifting the signal by −90° between 50 and 100 Ω, and are thus matched to 50 Ω at input and output. A resistor R2 connects the two division channels of each combiner/divider. The capacitors C2 of the Wilkinson combiners/dividers have low values and are duplicated for reasons of technological convenience. The resistors R2 of the Wilkinson combiners/dividers 12, 13, 14 and 15 entail a 3 dB transmission loss in the signal, but this type of combiner/divider, on the other hand, enables a summation or division of power of signals with relatively low SWRs (standing wave ratios). The Wilkinson combiner/divider also has the advantage of taking up little space. This is an important characteristic, notably if it should be necessary to make the duplexer according to the present invention on gallium arsenide.

The Wilkinson combiners/dividers can also be replaced by reactive 3 dB combiners/dividers, although they take up slightly more space. Indeed, these units have four ports, and it is therefore necessary to close one loop back on a resistor. The use of a greater number of elements consequently increases the effective area needed for their implantation.

The phase-shifter modules are Tee phase-shifters of the L4, C4, L4 type for the −45° phase shifter modules (modules 16 and 19) and of the C3, L3, C3 type for the +45° phase-shifter modules (modules 17 and 18). The capacitors C4 of the phase-shifters 16 and 19 are also duplicated for technological reasons. The phase-shifting modules may also be pi modules, may include additional components, for example four or five elements, or may be replaced by transmission lines with a length of L/4, where L is the wavelength of the signal transmitted.

This latter approach, however, has the drawback of taking up more space. Indeed, for a working frequency of 12 MHz for example, a transmission line such as this should have a length of the order of 6 mm, whence a lower output of the duplexer.

One of the advantages of the present invention is that the consumption of the duplexer shown is negligible in continuous operation, the transistors T1 being not biased on the drain. The only consumption in continuous operation comes from the gate leakage current of the field effect transistor T1. As a consequence, the heating of the device is negligible in continuous operation.

Naturally, the different elements constituting the structure of the duplexer according to the present invention may be easily modified by those skilled in the art without in any way thereby going beyond the scope of the present invention.

The duplexer according to the invention is advantageously made by means of MMIC technology. The transistors T1 may be either integrated, or may be placed out of the integrated circuit. In the latter case, INP transistors, which can work at high frequencies, will preferably be used.

Other modes of implanting the duplexer may be contemplated, notably modes using microstrip lines.

In a particular mode of use of the present invention, the transmission/reception of microwave signals is done in the 11.7–12.5 GHz band.

For operation in this frequency band, the values of the components are advantageously the following:

transistor:

T1=field effect transistor: 0.5 μm, two 75 μm fingers, Vp=−1 Volt resistors:

R1=2150 Ω (implant.: 215 Ω/squared L=100 μm, W=10 μm)

R2=100 Ω (metal.: 30 Ω/squared, L=33.3 μm, W=10 μm)

inductors:

L1=549.63 pH (N=2.5 turns, D=113 μm, W=10 μm)

L2=886.27 pH (N=2.75 turns, D=134.7 μm, W=10 μm)

L3=685.71 pH (N=1.5 turns, D=178.5 μm, W=10 μm)

L4=239.94 pH (N=1.5 turns, D=92 μm, W=10 μm)

capacitors:

C1=2500 fF (250 pF/mm$^2$, L=133 μm, W=75 μm)

C2=220.52 fF (250 pF/mm$^2$, L=29.7 μm, W=29.7 μm)

C3=538.93 fF (250 pF/mm$^2$, L=46.3 μm, W=46.3 μm)

C4=256 fF (250 pF/mm$^2$, L=32 μm, W=32 μm)

C5=3600 fF (250 pF/mm$^2$, L=120 μm, W=120 μm).

Figure 6:
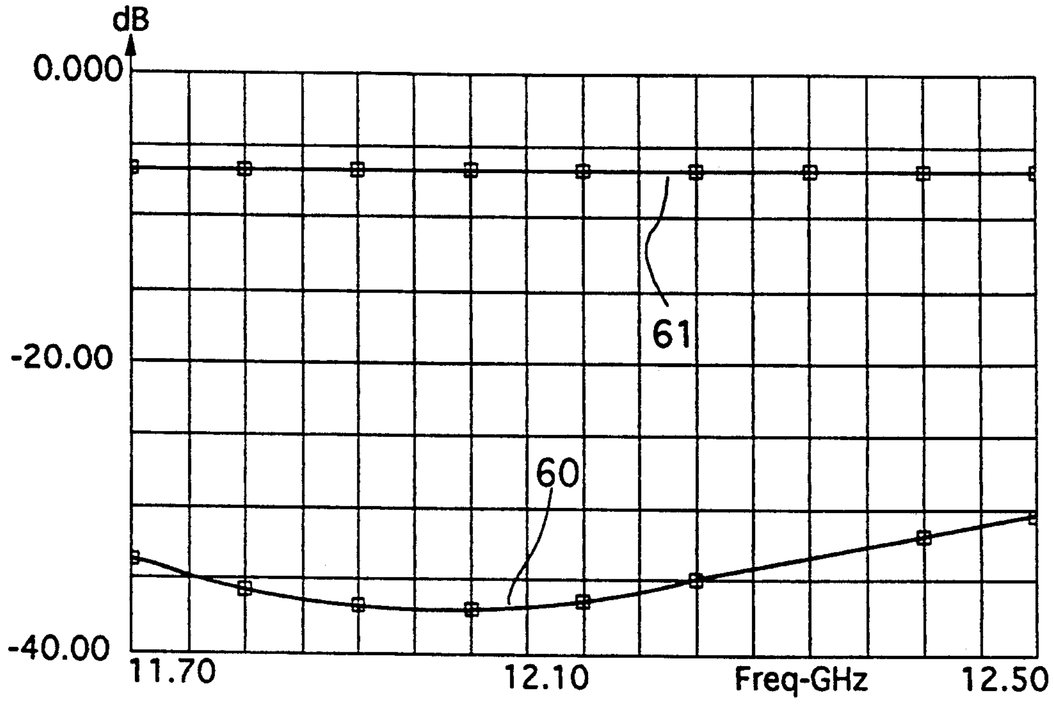
FIG. 6 shows a simulation of the variation, in decibels, of the isolation between the two arms constituting the duplexer according to the present invention, as a function of the working frequency as well as the transfer characteristic.
Figure 7:
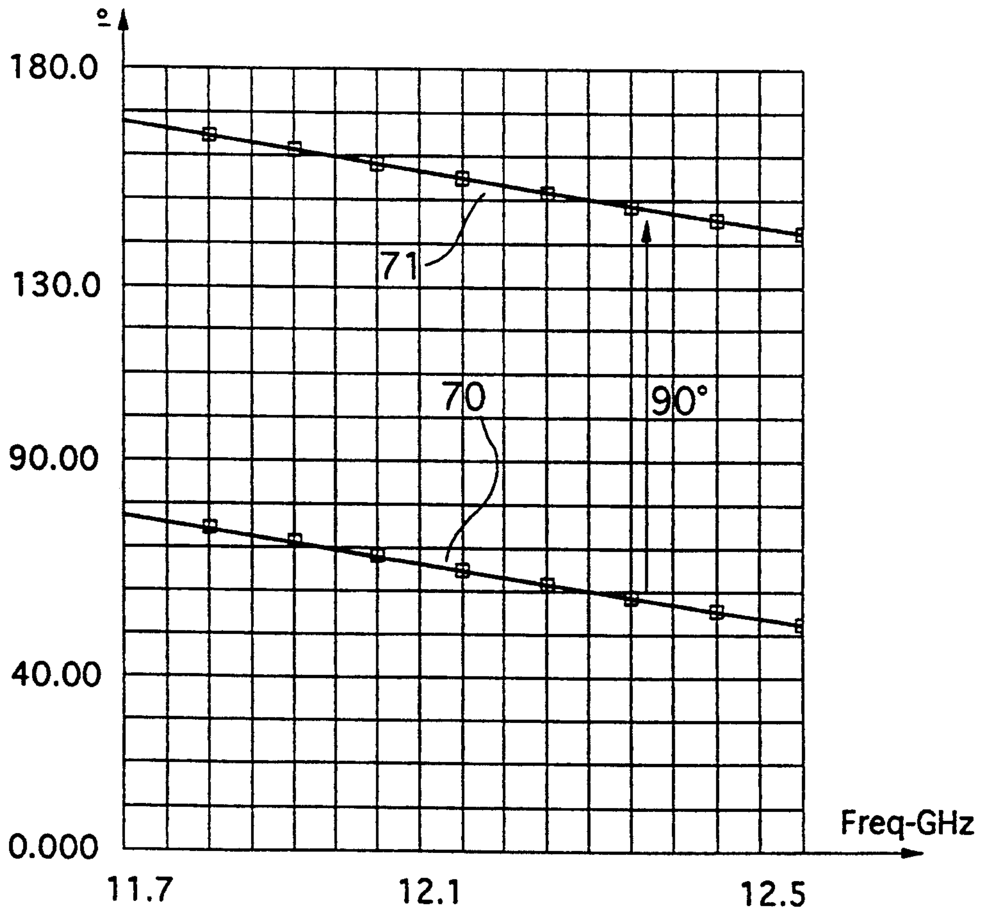
FIG. 7 shows a simulation of the angular variations of the parameters S31 and S32 of the characteristic matrix of the duplexer according to the present invention, as a function of the frequency.

FIGS. 6 and 7 show the variations of certain characteristic parameters of the duplexer according to the invention, as a function of the working frequency which varies from 11.7 to 12.5 GHz. These values have been obtained by simulation of the duplexer shown in FIG. 5, with the preceding values of components.

The duplexer according to the invention forms an octopole since it has four inputs/outputs. Owing to the symmetrical structure of this duplexer, it may be characterized by a matrix S of three lines and three columns, one of the inputs/outputs being connected to the ground through a resistor.

In one possible configuration, the input/output RF0 is connected to the ground by a 50 $_{106}$ resistor and signals are applied to the input RF1. The inputs/outputs RF1 and RF2 then constitute the outputs of the device.

The inputs/outputs RF0, RF1, RF2 and RF3 respectively correspond to the ports 1, 2, 3 and 4 relating to the parameters S.

FIG. 6 shows the variations in decibels of the parameters S 31, S 32 and S 21 of the duplexer according to the present invention, as a function of the working frequency, these variations resulting from a simulation.

The line 60 shows a simulation of the variation, in decibels, of the parameter S 21 as a function of the working frequency. The parameter S 21 characterizes the isolation between the two arms of the duplexer according to the invention. It is seen that this isolation is accurate in the 11.7–12.5 GHz band. This isolation is at least equal to −30 dB for a frequency of 12.5 GHz. The isolation between the two arms reaches −37 dB for a working frequency of 12 GHz approximately.

The line 61 represents a simulation of the variation in decibels of the parameters S31 and S32. This parameter characterizes the insertion losses of each arm in taking account of the fact that the signals are correlated with the inputs/outputs RF0 and RF1, this correlation being done throughout the 11.7–12.5 GHz frequency band.

The losses of each channel correspond to the parameters S31 and S32, these parameters being defined by:

S31=output signal at RF2/incident signal at RF0;

S32=output signal at RF2/incident signal at RF1.

The insertion losses of each arm are equal to −4.21±0.018 dB.

FIG. 7 shows the phase variation of the parameters S31 and S32 as a function of the frequency.

The line 70 represents the phase variation of the parameter S32, namely the phase shift between the outputs RF1 and RF2. The line 70 shows a linear variation as a function of the frequency, the phase shift between the outputs RF1 and RF2 getting smaller when the frequency increases.

The line 71 shows the phase variation of the parameter S31 as a function of the frequency, i.e. between the output RF2 and the input RF0. Its variation as a function of the frequency is also linear and diminishes when the frequency increases.

It is seen that the differential phase-shift between the lines 70 and 71 is almost constant and is equal to 89.88±0.71°. This differential phase-shift is adjustable by means of the phase-tuning cells 10 and 11.

The polarization discriminator according to the invention can be applied in many fields. For example, it can advantageously be used as a polarization changer by means of a repeater. Thus, a left-hand circularly polarized wave may be converted into a right-hand circularly polarized wave and vice versa.

The invention can also be applied to the transmission and reception of circular waves from printed antennas or printed antenna arrays. It can also be used in the context of the duplexer with re-utilization of cross-polarized frequencies.

Another application of the present invention lies in its use for the transmission of vertically and/or horizontally polarized microwaves.

Figure 8:
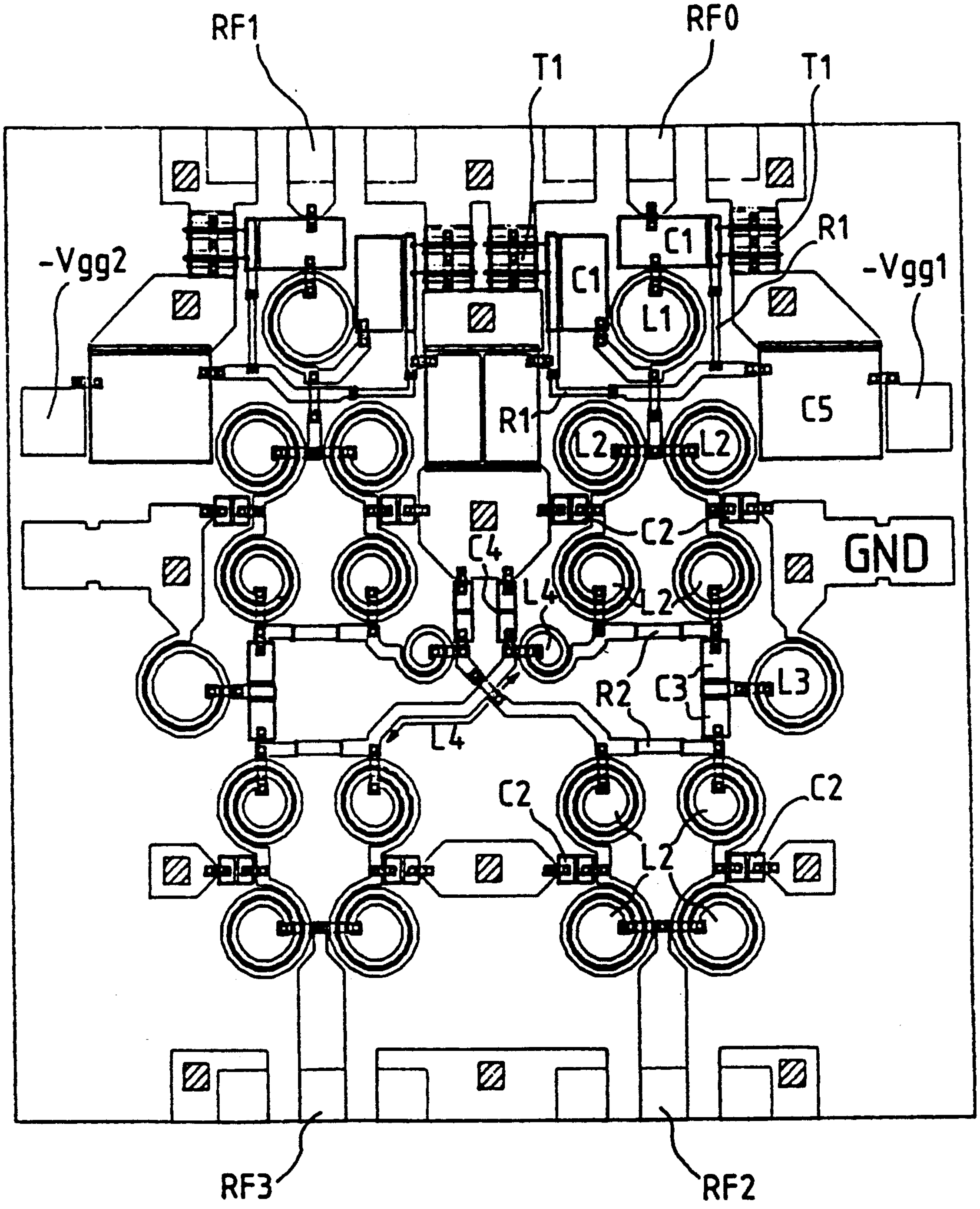
FIG. 8 shows an example of a topography, on an integrated circuit, of a duplexer such as this made by MMIC technology.

FIG. 8 shows an exemplary topography of such a duplexer on an integrated circuit. The duplexer is made by MMIC technology, using integrated transistors T1. The schematic diagram chosen for this topography is that of FIG. 5, with the above-mentioned values of components.

The different elements of the electrical diagram are made according to the metalworking practices used by THOMSON/DAG (registered name).

For reasons of clarity of the topography shown, and owing to the symmetry of the structure of the duplexer according to the invention, only one arm has been referenced. The symmetry of the structure is seen again in the topography of FIG. 8. The low values of the components mean that the duplexer according to the invention takes up very little space.

It is naturally possible to make the device of the invention by means of other technologies.

What is claimed is:

1. A two-way duplexer for polarized microwaves, comprising:

a first set of input/outputs, wherein the first set of input/outputs comprises a first input/output capable of receiving and transmitting a vertically polarized signal and a second input/output capable of receiving and transmitting a horizontally polarized signal;

a second set of input/outputs, wherein the second set of input/outputs comprises a third input/output capable of receiving and transmitting a right-hand circularly polarized signal and a fourth input/output capable of receiving and transmitting a left-hand circularly polarized signal;

a plurality of combiner/dividers including a first, a second, a third and a fourth combiner/divider, wherein each combiner/divider comprises a combination channel operatively coupled to first and second division channels, wherein the first, second, third and fourth input/outputs are connected to the combination channel of the first, second, third and fourth combiner/dividers, respectively, wherein:

the first division channel of the first combiner/divider is connected through first phase-shifting means to the first division channel of the third combiner/divider;

the second division channel of the first combiner/divider is connected through second phase-shifting means to the first division channel of the fourth combiner/divider;

the first division channel of the second combiner/divider is connected through third phase-shifting means to the second division channel of the third combiner/divider; and the second division channel of the second combiner/divider is connected through fourth phase-shifting means to the second division channel of the fourth combiner/divider;

wherein said first and third phase-shifting means introduce first and third phase shifts, respectively, wherein a difference in absolute value between the first phase shift and the third phase shift is approximately equal to 90° modulo 360°; and and wherein said second and fourth phase-shifting means introduce second and fourth phase shifts, respectively, wherein a difference in absolute value between the second phase shift and the fourth phase shift is approximately equal to 90° modulo 360°.

2. A duplexer according to claim 1, wherein one of said combiner/dividers is a Wilkinson Tee type three-port structure.

3. A duplexer according to claim 1, wherein the first input/output comprises first phase-tuning means connected to the combination channel of the first combiner/divider and wherein the second input/output comprises second phase-tuning means connected to the combination channel of the second combiner/divider.

4. A duplexer according to claim 3, wherein each of the first and second phase-tuning means comprise field effect transistors operatively configured to provide voltage controlled capacitance.

5. A duplexer according to claim 1, wherein said second and third phase-shifting means provide for a $+\pi/4$ phase shift, and wherein said first and fourth phase-shifting means provide for a $-\pi/4$ phase-shift.

6. A duplexer according to claim 1, wherein each of said phase-shifting means are highpass type phase-shifting cells.

7. A duplexer according to claim 1, wherein each of said phase-shifting means are lowpass type phase-shifting cells.

8. A duplexer according to claim 1, wherein each input/output comprises means for providing an impedance of approximately 50 to 100 Ω.

9. A duplexer according to claim 1, wherein each said combiner/divider is a Wilkinson pi type structure.

10. A duplexer according to claim 1, wherein the duplexer further comprises a vertically polarized antenna connected to the first input/output, a horizontally polarized antenna connected to the second input/output and a processing unit connected to the third and fourth input/outputs.

11. A duplexer according to claim 1, wherein said second and third phase-shifting means provide for a $-\pi/4$ phase shift, and wherein said first and fourth pahse-shifting means provide for a $+\pi/4$ phase-shift.

12. A duplexer according to claim 1, wherein at least one of said combiner/dividers is a Wilkinson pi type three-port structure.

13. A duplexer according to claim 1, wherein each said combiner/divider is a Wilkinson Tee type three-port structure.

14. A two-way duplexer for microwaves, comprising:

a plurality of input/outputs including a first, a second, a third and a fourth input/output;

first, second, third and fourth combiner/dividers connected to the first, second, third and fourth input/outputs, respectively;

first phase-shifting means, connected to the first and third combiner/dividers, for providing a first phase shift;

second phase-shifting means, connected to the first and fourth combiner/dividers, for providing a second phase shift;

third phase-shifting means, connected to the second and third combiner/dividers, for providing a third phase shift;

fourth phase-shifting means, connected to the second and fourth combiner/dividers, for providing a fourth phase shift;

wherein the first and second phase shifts differ by approximately 90° modulo 360°;

wherein the first and third phase shifts differ by approximately 90° modulo 360°;

wherein the second and fourth phase shifts differ by approximately 90° modulo 360°;

wherein the third and fourth phase shifts differ by approximately 90° modulo 360°;

wherein a transmit signal CD received at the third input/output is transformed by said third combiner/divider and said first and third phase-shifting means into first and second phase-shifted transmit signals having first and second polarizations, respectively, said first and second phase-shifted transmit signals being transmitted by the first and second input/outputs, respectively;

wherein a transmit signal CG received at the fourth input/output is transformed by said fourth combiner/divider and said second and fourth phase-shifting means into third and fourth phase-shifted transmit signals having first and second polarizations, respectively, said third and fourth phase-shifted transmit signals being transmitted by the second and first input/outputs, respectively; and wherein components of a circularly polarized signal received by the first and second input/outputs, respectively, are phase-shifted by the first, second, third and fourth phase-shifting means and are combined into a first receive signal by the third combiner/divider and into a second receive signal by the fourth combiner/divider, wherein one of the first and second receive signals has a maximum amplitude and the other of the first and second receive signals has approximately zero amplitude.

15. The two-way duplexer according to claim 14 wherein the two-way duplexer further comprises a vertically polarized antenna connected to the first input/output and a horizontally polarized antenna connected to the second input/output.

16. The two-way duplexer according to claim 14 wherein the two-way duplexer further comprises first and second polarized antennas connected to the first and second input/outputs, respectively, wherein the first antenna is configured to receive vertically polarized components of a circularly polarized wave and wherein the second antenna is configured to receive horizontally polarized components of the circularly polarized wave.

17. The two-way duplexer according to claim 14 wherein the two-way duplexer further comprises first and second polarized antennas connected to the first and second input/outputs, respectively, wherein the first antenna is configured to receive horizontally polarized components of a circularly polarized wave and wherein the second antenna is configured to receive vertically polarized components of the circularly polarized wave.

18. The two-way duplexer according to claim 14 wherein at least one of the combiner/dividers comprises a Wilkinson Tee type three-port structure.

19. The two-way duplexer according to claim 14 wherein at least one of the combiner/dividers comprises a Wilkinson pi type three-port structure.

20. The two-way duplexer according to claim 14 wherein the two-way duplexer further comprises a phase tuning cell connected between the first input/output and the first combiner/divider.

21. The two-way duplexer according to claim 20 wherein the phase tuning cell comprises a structure operatively connected to said first input/output and said first combiner/divider.

22. The two-way duplexer according to claim 20 wherein the phase tuning cell comprises a pi structure operatively connected to said first input/output and said first combiner/divider.

23. The two-way duplexer according to claim 20 wherein the phase tuning cell comprises field effect transistors configured to provide voltage controlled capacitance.

24. The two-way duplexer according to claim 14 wherein each of the first second, third and fourth phase-shifting means comprise means for providing approximately 45° phase-shifts.

25. The two-way duplexer according to claim 14 wherein the first input/output comprises means for providing an impedance of approximately 50 to 100 Ω.

* * * * *

UNITED STATES PATENT AND TRADEMARK OFFICE

CERTIFICATE OF CORRECTION

PATENT NO. : 5,247,269

DATED : 21 September 1993

INVENTOR(S) : Boulouard et al.

It is certified that error appears in the above-identified patent and that said Letters Patent is hereby corrected as shown below:

In column 4, line 63, delete "polariztion" and insert --polarization--.

In column 4, line 63, delete "Transmitter 1 receiver" and insert --Transmitter/receiver--.

In column 5, line 9, delete "had" and insert --hand--.

In column 5, line 26, insert --, is-- after the word "duplexer".

In column 5, line 28, delete "respcetively" and insert --respectively--.

In column 5, lines 28 and 29, delete "combiner 1 divider" and insert --combiner/divider--.

In column 5, line 57, insert -- H -- after the word "horizontal".

In column 6, line 27, delete "cirularly" and insert --circularly--.

In column 9, line 10, delete "50 $_{106}$" and insert --50 Ω--.

UNITED STATES PATENT AND TRADEMARK OFFICE

CERTIFICATE OF CORRECTION

PATENT NO. : 5,247,269

DATED : Sept. 21, 1993

INVENTOR(S) : Andre Boulouard, et al

It is certified that error appears in the above-indentified patent and that said Letters Patent is hereby corrected as shown below:

Column 12, claim 21, line 68, delete "a structure" and insert

--a Tee structure--

Signed and Sealed this

Twenty-second Day of March, 1994

Attest:

Bruce Lehman

BRUCE LEHMAN

*Attesting Officer* *Commissioner of Patents and Trademarks*